United States Patent
Shiokawa et al.

(10) Patent No.: US 12,550,314 B2
(45) Date of Patent: Feb. 10, 2026

(54) SEMICONDUCTOR DEVICE

(71) Applicant: Kioxia Corporation, Tokyo (JP)

(72) Inventors: Taro Shiokawa, Nagoya Aichi (JP);
Takeru Maeda, Yokkaichi Mie (JP);
Kotaro Noda, Yokkaichi Mie (JP);
Shosuke Fujii, Kuwana Mie (JP)

(73) Assignee: KIOXIA CORPORATION, Tokyo (JP)

( * ) Notice: Subject to any disclaimer, the term of this patent is extended or adjusted under 35 U.S.C. 154(b) by 521 days.

(21) Appl. No.: 18/179,620

(22) Filed: Mar. 7, 2023

(65) Prior Publication Data

US 2024/0057313 A1 Feb. 15, 2024

(30) Foreign Application Priority Data

Aug. 12, 2022 (JP) ................. 2022-128693

(51) Int. Cl.
*H10B 12/00* (2023.01)
(52) U.S. Cl.
CPC ............. *H10B 12/33* (2023.02); *H10B 12/05* (2023.02)
(58) Field of Classification Search
CPC ........ H10B 12/33; H10B 12/05; H10D 30/67; H10D 30/6755; H10D 86/423; H10D 86/451; H10D 86/60; H10D 99/00
See application file for complete search history.

(56) References Cited

U.S. PATENT DOCUMENTS

| | | | | |
|---|---|---|---|---|
| 9,564,457 | B2* | 2/2017 | Yamazaki | H10D 86/471 |
| 9,698,272 | B1* | 7/2017 | Ikeda | H10D 86/481 |
| 2006/0211235 | A1* | 9/2006 | Usami | H01L 23/5222 |
| | | | | 438/618 |
| 2014/0025978 | A1* | 1/2014 | Tokunaga | G06F 1/30 |
| | | | | 713/323 |
| 2019/0041932 | A1* | 2/2019 | Hanada | H10D 86/60 |
| 2022/0199831 | A1* | 6/2022 | Asami | H10D 64/518 |
| 2024/0298435 | A1* | 9/2024 | Miyairi | H10D 30/67 |

FOREIGN PATENT DOCUMENTS

| | | |
|---|---|---|
| JP | 2006-261440 A | 9/2006 |
| JP | 2017-168623 A | 9/2017 |

* cited by examiner

*Primary Examiner* — S M Sohel Imtiaz
(74) *Attorney, Agent, or Firm* — Foley & Lardner LLP

(57) ABSTRACT

A semiconductor device includes a semiconductor substrate, a first layer formed on the semiconductor substrate and including a semiconductor element and a first insulating film, a second layer formed above the first layer and including a channel including an oxide semiconductor and a second insulating film, and a third layer formed above the second layer, and including an electrode formed on the channel and a third insulating film having a film density less than at least one of a film density of the first insulating film or a film density of the second insulating film.

16 Claims, 14 Drawing Sheets

SEMICONDUCTOR DEVICE

CROSS-REFERENCE TO RELATED APPLICATION

This application is based upon and claims the benefit of priority from Japanese Patent Application No. 2022-128693, filed Aug. 12, 2022, the entire contents of which are incorporated herein by reference.

FIELD

Embodiments described herein relate generally to a semiconductor device.

BACKGROUND

The development of utilizing an oxide semiconductor as the channel of a semiconductor device has been proposed. For example, there is a dynamic random access memory (DRAM) in which an oxide semiconductor transistor is applied to a switching transistor of a memory cell.

DETAILED DESCRIPTION

Figure 1:
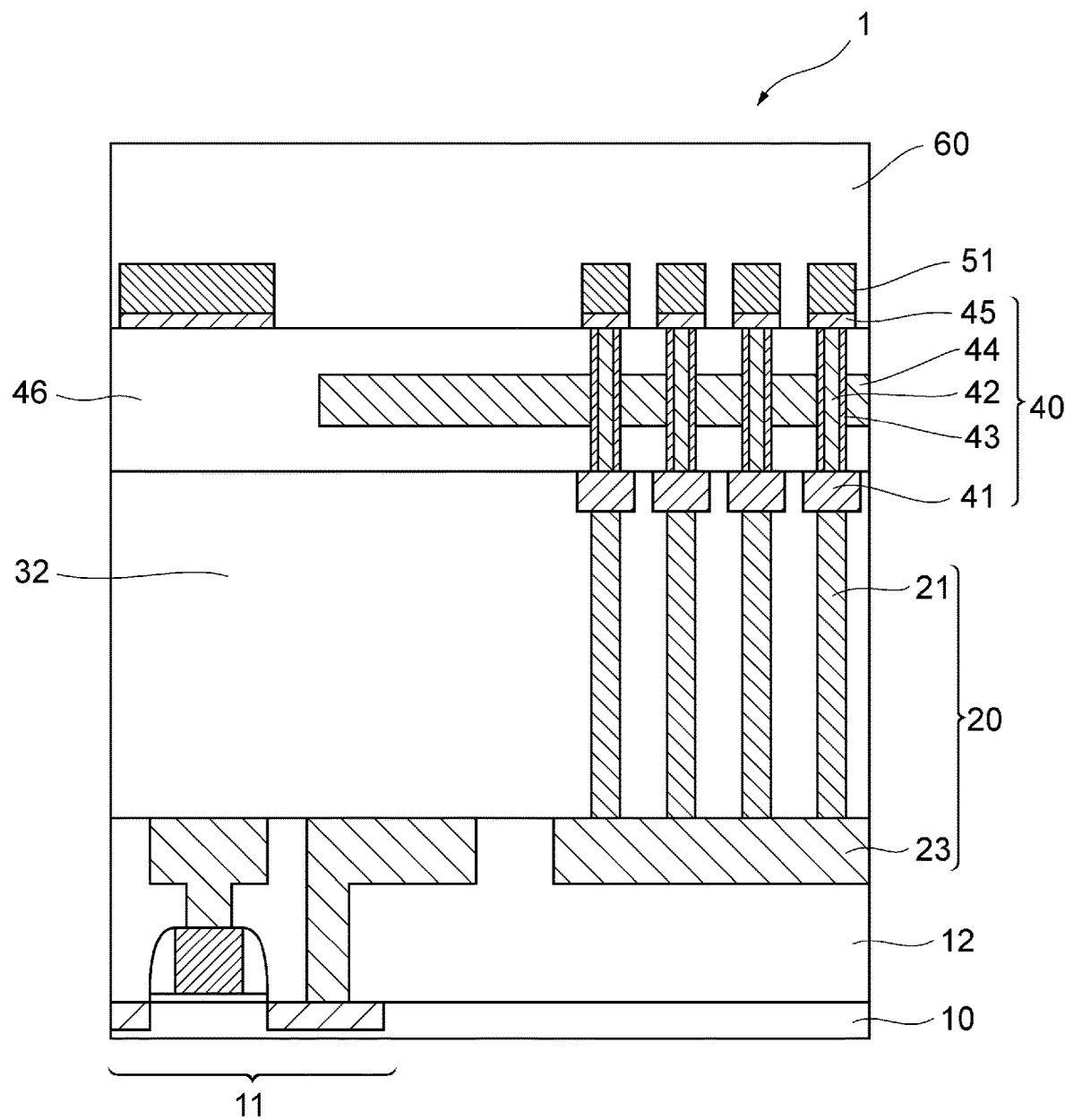
FIG. 1 is a schematic cross-sectional view showing a configuration example of a semiconductor memory device according to a first embodiment.

Embodiments provide a semiconductor device capable of reducing a supply of oxygen to a semiconductor not requiring oxygen supply, while supplying oxygen to a semiconductor requiring oxygen supply.

In general, according to one embodiment, a semiconductor device includes a semiconductor substrate, a first layer formed on the semiconductor substrate and including a semiconductor element and a first insulating film, a second layer formed above the first layer and including a channel including an oxide semiconductor and a second insulating film, and a third layer formed above the second layer, and including an electrode formed on the channel and a third insulating film having a film density less than at least one of a film density of the first insulating film or a film density of the second insulating film.

Hereinafter, embodiments will be described with reference to the drawings. In the following description, the same or similar components may be denoted by the same reference numerals and description thereof may be omitted.

In the description, the terms "upper" and "lower" may be used for convenience of explanation, but these describe relative locations in the drawings and do not define absolute positional relationships. For example, "above" or "below" in the present embodiment may be different from "above" or "below" in the vertical direction. In addition, in the description, part of the configuration of a semiconductor device may be expressed without distinction as a "layer" or a "film".

First Embodiment

A semiconductor memory device according to the present embodiment relates to a dynamic random access memory (DRAM) and includes a memory cell array including a plurality of memory cells. Each memory cell includes a field effect transistor (FET) and a capacitor. The memory cells are located in rows and columns to form the memory cell array. However, the plurality of memory cells may be located not only in rows and columns but also vertically. The field effect transistor in the memory cell includes a gate connected to a corresponding word line, one of a source and a drain connected to one electrode of the capacitor, and the other of the source and the drain connected to a corresponding bit line. One electrode of the capacitor may be connected to one electrode of the field effect transistor as described above so as to be able to supply charges. The other electrode of the capacitor may be connected to a power supply line that supplies a predetermined voltage. The memory cell is configured to be able to store data by storing charges in the capacitor from the bit line by the field effect transistor switched by the word line. A semiconductor memory device 1 according to the present embodiment will be described as an example of the semiconductor device.

Configuration of Semiconductor Memory Device 1

FIG. 1 is a schematic cross-sectional view showing a configuration example of the semiconductor memory device 1 according to the present embodiment. As shown in FIG. 1, the semiconductor memory device 1 includes a semiconductor substrate 10, a semiconductor element 11, an insulating layer 12, a capacitor structure 21, a lower capacitor electrode 23, an insulating layer 32, a lower electrode 41, an oxide semiconductor layer 42, a gate oxide film 43, a word line 44, an upper electrode 45, an insulating layer 46, a bit line 51, and an insulating layer 60. A metal layer serving as a landing pad may be formed between the upper electrode 45 and the bit line 51 to facilitate mutual connection.

For example, the semiconductor substrate 10 is a substrate including single crystal silicon and the like.

The semiconductor element 11 is a metal-oxide-semiconductor field effect transistor (MOSFET) or the like formed on the semiconductor substrate 10, but may be another semiconductor element. For example, unlike a field effect transistor 40 (FIG. 1), the semiconductor element 11 may have a channel using silicon. For example, the semiconductor element 11 forms a semiconductor integrated circuit including CMOS for controlling the memory cell array.

The insulating layer 12 (an example of a "first insulating film") is an insulator formed in a layer shape on the semiconductor substrate 10. The insulating layer 12 is formed in the same layer as the semiconductor element 11 to electrically insulate the semiconductor element 11 and wiring (conductors, and the like) connected thereto. For example, the insulating layer 12 is a silicon oxide film ($SiO_2$) including silicon and oxygen.

The capacitor 20 and the insulating layer 32 (an example of a "fourth insulating film") are formed in a layer (an example of a "fourth layer") above the layer (an example of a "first layer") in which the semiconductor element 11 and the insulating layer 12 are formed.

The capacitor 20 of the present embodiment is a three-dimensional capacitor such as a so-called pillar capacitor, cylinder capacitor, or the like. The capacitor 20 includes the capacitor structure 21 and the lower capacitor electrode 23 and is configured to be able to store charge between the lower electrode 41 and the lower capacitor electrode 23. The capacitor structure 21 is a known structure including a dielectric capable of storing a charge and serving as a capacitor.

The field effect transistor 40 and the insulating layer 46 (an example of a "second insulating film") having the oxide semiconductor layer 42 as a channel are formed in a layer (an example of a "second layer") above the layer (an example of the "fourth layer") in which the capacitor 20 and the insulating layer 32 are formed. In the present embodiment, the lower electrode 41, the oxide semiconductor layer 42, the gate oxide film 43, the word line 44 and the upper electrode 45 form the field effect transistor 40. The field effect transistor 40 is formed above the capacitor 20. The field effect transistor 40 is a component of the memory cell. FIG. 1 shows four field effect transistors 40 paired with four capacitors 20. The number of field effect transistors 40 may be freely changed according to the number of capacitors 20.

The lower electrode 41 is provided on the capacitor structure 21 and electrically connected to the capacitor structure 21. For example, the lower electrode 41 includes metal oxide such as indium tin oxide (ITO) and the like.

The oxide semiconductor layer 42 is formed in a through via hole formed between the lower electrode 41 and the upper electrode 45 and extends vertically in a columnar shape. For example, the oxide semiconductor layer 42 is an oxide including indium (In), gallium (Ga), and zinc (Zn). The oxide semiconductor layer 42 forms the channel of the field effect transistor 40.

The gate oxide film 43 is provided between the oxide semiconductor layer 42 and the word line 44 so as to cover a periphery of the oxide semiconductor layer 42. The gate oxide film 43 is an insulator, such as a silicon oxide film ($SiO_2$) including silicon (Si) and oxygen (O).

The word line 44 is a word line in the memory cell and also forms the gate electrode of the field effect transistor 40. For example, the word line 44 is a conductor including at least one material selected from the group consisting of tungsten (W), titanium (Ti), titanium nitride (TiN), molybdenum (Mo), cobalt (Co), and ruthenium (Ru), and typically includes tungsten.

The upper electrode 45 is provided on the oxide semiconductor layer 42. For example, the upper electrode 45 is a conductor including conductive oxide, and includes metal oxide such as indium tin oxide (ITO) and the like.

The upper electrode 45 serves as one of a source electrode or a drain electrode of the field effect transistor 40, and the lower electrode 41 serves as the other of the source electrode or the drain electrode of the field effect transistor 40.

In the field effect transistor 40 configured as described above, a voltage is applied to the word line 44 serving as the gate electrode to generate a predetermined voltage difference between the word line 44 and the source or drain electrode, so that an electric field is generated in the channel region of the oxide semiconductor layer 42. Therefore, carriers (electrons or holes) flow between the source electrode and the drain electrode. It can also be said that the word line 44 serving as the gate electrode is a control electrode for generating an electric field in the oxide semiconductor layer 42 serving as a channel.

The bit line 51 is formed on the upper electrode 45. For example, the bit line 51 includes a conductor such as tungsten (W) or the like. A landing pad structure may be formed between the bit line 51 and the upper electrode 45 to facilitate connection. For example, the landing pad may include tungsten (W), ruthenium (Ru), molybdenum (Mo), or a stacked structure of a plurality of metals including these. In addition, a barrier metal may be formed between the bit line or landing pad and the upper electrode. For example, the barrier metal includes a conductor such as tantalum (Ta), tantalum nitride (TaN), or the like.

The insulating layer 32 is an insulator that electrically insulates between the capacitors 20 in the layer in which the capacitors 20 are formed. For example, the insulating layer 32 is a silicon oxide film ($SiO_2$) including silicon and oxygen.

The insulating layer 46 is an insulator provided in the layer in which the oxide semiconductor layer 42 and the like are formed. For example, the insulating layer 46 is a silicon oxide film ($SiO_2$) including silicon and oxygen.

The insulating layer 60 (an example of a "third insulating film") formed in a layer above the insulating layer 46 is an insulator formed in a layer (an example of a "third layer") including the upper electrode 45 and the bit line 51 formed on the upper electrode 45. The insulating layer 60 electrically insulates the upper electrode 45 and the bit line 51 from the adjacent upper electrode 45 and bit line 51. For example, the insulating layer 60 is a silicon oxide film ($SiO_2$) including silicon and oxygen.

As described above, the semiconductor memory device 1 according to the present embodiment includes two types of transistors, including a first transistor (the semiconductor element 11) and a second transistor (the field effect transistor 40) having an oxide semiconductor channel (a channel including oxygen atoms). For example, the first transistor is an N-type semiconductor element having a channel formed by adding an element such as phosphorus (P) and the like to silicon or the like, or a P-type semiconductor element having a channel formed by adding an element such as boron (B) and the like to silicon or the like. The second transistor is an N-type or P-type semiconductor element having a compound semiconductor channel including oxygen atoms and other elements as a channel. While it is necessary to supply oxygen in the manufacturing process to the second transistor having an oxide semiconductor as a channel in order to adjust the threshold voltage of the semiconductor, it is also preferable that supply of excess amount of oxygen is prevented, because supply of oxygen to the first transistor (the semiconductor element 11) results in changes in the characteristics of the semiconductor element 11 and the unstable threshold voltage.

Meanwhile, the inventors of the present application found that less oxygen permeates through the insulating film as the film density of the insulating film increases. For example, for the insulating films formed at the temperatures of 300° C. and 400° C., respectively, the insulating film formed at 300° C. has a lower film density than that of the insulating film formed at 400° C. It was confirmed that sufficient oxygen is supplied to the oxide semiconductor located under the insulating film that is formed at 300° C., and a semiconductor having a desired threshold voltage is formed, while insufficient oxygen is supplied to the oxide semiconductor located under the insulating film that is formed at 400° C., and the oxide semiconductor does not have a desired threshold voltage.

Therefore, in the semiconductor memory device 1 according to the present embodiment, a configuration is adopted in which a film density of the insulating layer 32 is higher than a film density of the insulating layer 60. In other words, in the semiconductor memory device 1, a configuration is adopted in which the film density of the insulating layer 60 in the third layer is less than at least one of a film density of the insulating layer 12 in the first layer and the film density of the insulating layer 32 in the second layer. Furthermore, in the present embodiment, a configuration is adopted in which the film density of the insulating layer 12 in the first layer, the film density of the insulating layer 32 in the second layer, and a film density of the insulating layer 46 in the fourth layer are the same as each other. That is, a configuration is adopted in which the film densities of the insulating layer 12, the insulating layer 32, and the insulating layer 46 are equal to each other, and the film density of the insulating layer 60 is lower than these film densities.

By adopting the configuration described above, in the semiconductor memory device 1, it is possible to promote the supply of oxygen to the oxide semiconductor layer 42 located under the insulating layer 60 having a relatively low film density, while reducing the supply of oxygen to the semiconductor element 11 located under the insulating layer 32 having a relatively high film density. Therefore, it is possible to stabilize both the threshold voltage of the first type transistor having an oxide semiconductor as a channel, and the threshold voltage of the second type transistor not having an oxide semiconductor as a channel.

Method for Manufacturing Semiconductor Memory Device 1

Hereinbelow, a method for manufacturing the semiconductor memory device 1 will be described mainly with reference to the characteristics of the present embodiment. A known method for manufacturing a semiconductor device can be adopted for the processes other than the processes described below, and the description thereof will be omitted.

In the method for manufacturing the semiconductor memory device 1 according to the present embodiment, first, the semiconductor element 11 is formed on the semiconductor substrate 10 using a known method, and then the insulating layer 12 forms the first layer.

Then, the insulating layer 32 is formed, and then patterning, etching, film formation, and the like are repeatedly performed on the insulating layer 32 to form the capacitor 20, thereby forming the fourth layer on the first layer. When forming the insulating layer 32, for example, tetraethoxysilane (TEOS) is used as a material, and an insulating layer of silicon oxide ($SiO_2$) is formed by a plasma CVD (PECVD) method using plasma at a predetermined temperature.

Then, the insulating layer 46 and the word lines 44 are formed in the same manner, and then etching, film formation, and the like are repeatedly performed on the insulating layer 46 and the word lines 44 to form the oxide semiconductor layer 42, thereby forming the second layer on the fourth layer.

Then, the upper electrode 45 and the bit line 51 are formed. Then, the insulating layer 60 forms the third layer on the second layer. When forming the insulating layer 60, TEOS is used as a material, and an insulating layer of silicon oxide ($SiO_2$) is formed by a plasma CVD method using plasma at a temperature lower than when the insulating layer 32 is formed. Accordingly, the film density of the insulating layer 60 can be made lower than the film density of the insulating layer 32.

Furthermore, the present embodiment provides a configuration in which the insulating layer 12 in the first layer, the insulating layer 32 in the second layer, and the insulating layer 46 in the fourth layer are formed at approximately the same temperature, and the insulating layer 60 in the third layer is formed at a temperature higher than the film forming temperature of the insulating layer 12 in the first layer and the like, such that the film density of the insulating layer 12 in the first layer, the film density of the insulating layer 32 in the second layer, and the film density of the insulating layer 46 in the fourth layer are substantially the same as each other, and the film density of the insulating layer 60 in the third layer is higher than the film density of the insulating layer 12 in the first layer and the like.

In a process that follows the formation of the insulating layer 60, oxygen annealing is performed by heating to supply oxygen to the oxide semiconductor layer 42. As a result, oxygen is supplied to the oxide semiconductor layer 42 from the surface of the insulating layer 60 via the insulating layer 60 and the upper electrode 45.

Meanwhile, the insulating layer 32 has a higher film density than the insulating layer 60 and has a lower oxygen permeability, and accordingly, the supply of oxygen to the layer under the insulating layer 32 is reduced. Therefore, oxygen is not supplied more than necessary to the semiconductor element 11 located under the insulating layer 32, and the characteristics can be maintained.

Modifications

The semiconductor memory device 1 according to the present embodiment is not limited to the configuration described above, and may have the following configurations, for example.

First Modification

According to the embodiment, the film densities of the insulating layers 12, 32, and 46 are equal to each other, and the film density of the insulating layer 60 is set to be less than these film densities, but it is also possible that the film densities of the insulating layers 12 and 46 are freely set. In this case, it is still possible to supply oxygen to the oxide semiconductor layer 42 located immediately under the insulating layer 60 having a low film density, and reduce the supply of oxygen to the semiconductor element 11 located under the insulating layer 32 having a high film density.

Second Modification

The semiconductor memory device 1 may be configured such that the film density of the insulating layer 60 is relatively low, and the film density of the insulating layers 46 or 12 is higher than the film density of the insulating layer 60. At this time, the film density of the insulating layer 32 may be freely set. In this case, it is still possible to supply oxygen to the oxide semiconductor layer 42 located immediately under the insulating layer 60. In addition, in this configuration, since the film density of the insulating layers 46 or 12 located between the semiconductor element 11 and the oxide semiconductor layer 42 is high, the supply of oxygen to the semiconductor element 11 located thereunder is reduced.

Third Modification

According to the embodiment, the insulating layers 12, 32, 46, and 60 all have substantially the same configuration including silicon and oxygen, and the film density is adjusted by changing the temperature of the plasma used for plasma CVD, but embodiments are not limited thereto. That is, as long as the relationship between the film densities of the embodiment and the modification can be ensured, different materials may be used, or the temperature of plasma CVD for forming the insulating layer may be identically set or freely changed, or the process for forming the insulating layer may be other than plasma CVD. For example, silicon nitride (SiN), aluminum oxide ($Al_2O_3$), or other materials having a high dielectric constant may be used as the material of the insulating layer having a high film density.

Meanwhile, when silicon nitride (SiN), aluminum oxide ($Al_2O_3$), or the like is used as the material of the insulating layer having a high film density for reducing permeation of oxygen, permeation of hydrogen may be reduced and sufficient hydrogen may not be supplied to the semiconductor element 11 in a hydrogen annealing process in which hydrogen is supplied to the semiconductor element 11 for the purpose of improving characteristics. Therefore, it is preferable to use a material such as silicon oxide ($SiO_2$) or the like having hydrogen permeability as the material of the insulating layer having a high film density.

Fourth Modification

In the semiconductor memory device 1, when a material having hydrogen permeability such as silicon oxide ($SiO_2$) or the like is used as the material of the insulating layer 60, in the hydrogen annealing process, hydrogen is supplied to the oxide semiconductor layer 42, and the characteristics of the oxide semiconductor layer 42 may change. In order to reduce such a change in the characteristics of the oxide semiconductor layer 42 as described above, a hydrogen barrier film for blocking permeation (or diffusion) of hydrogen may protect the periphery of the oxide semiconductor layer 42. For example, the hydrogen barrier film in this case may be provided in a box shape that accommodates at least part of the oxide semiconductor layer 42 therein so as to cover the periphery of the oxide semiconductor layer 42.

The embodiment and modifications of the semiconductor memory device 1 are described above. As can be seen from the embodiment and modifications, the semiconductor memory device 1 described in the present embodiment and modifications includes the semiconductor substrate 10, the first layer including the semiconductor element 11 and the insulating layer 12, and the second layer formed above the first layer and including the oxide semiconductor layer 42 and the insulating layer 46. The oxide semiconductor layer 42 forms a channel. The upper electrode 45 is formed on the channel. The third layer formed above the second layer includes the upper electrode 45 and the insulating layer 60.

The insulating layer 60 in the third layer herein has a lower film density than either the insulating layer 12 or the insulating layer 46. That is, either the insulating layer 12 in the first layer or the insulating layer 46 in the second layer has a higher film density than the insulating layer 60 in the third layer.

With such a configuration, it is possible to supply sufficient oxygen to the oxide semiconductor layer 42 located under the insulating layer 60 having a relatively lower film density, and reduce the supply of oxygen to the semiconductor element 11 formed under the insulating layer 32 having a relatively higher film density. As a result, the characteristics of the semiconductor element 11 can be maintained as desired while the oxide semiconductor layer 42 has a desired threshold voltage.

In addition, an insulating layer (for example, the insulating layer 32) may be provided in the fourth layer between the first layer and the second layer, and the film density of the insulating layer 60 in the third layer may be lower than at least one of the insulating layers located in the first, second, and fourth layers. In other words, any one of the insulating layers (for example, the insulating layers 12, 46, and 32) located in the first, second, and fourth layers may have a higher film density than the insulating layer 60 in the third layer which is the uppermost layer of these four layers. It is also possible to achieve the object described above by adopting these configurations.

Second Embodiment

Next, a second embodiment will be described. A semiconductor memory device 2 according to the second embodiment relates to a shape of the oxide semiconductor layer 42 forming a channel and formed in a through via hole, and a manufacturing method thereof. It is noted that components having the same or similar functions and configurations as those of the first embodiment will be denoted by the same or similar reference numerals, descriptions thereof will be omitted or simplified, and differences from the first embodiment will be mainly described. Details will be given below with reference to the drawings.

Configuration of Semiconductor Memory Device 2

Figure 2:
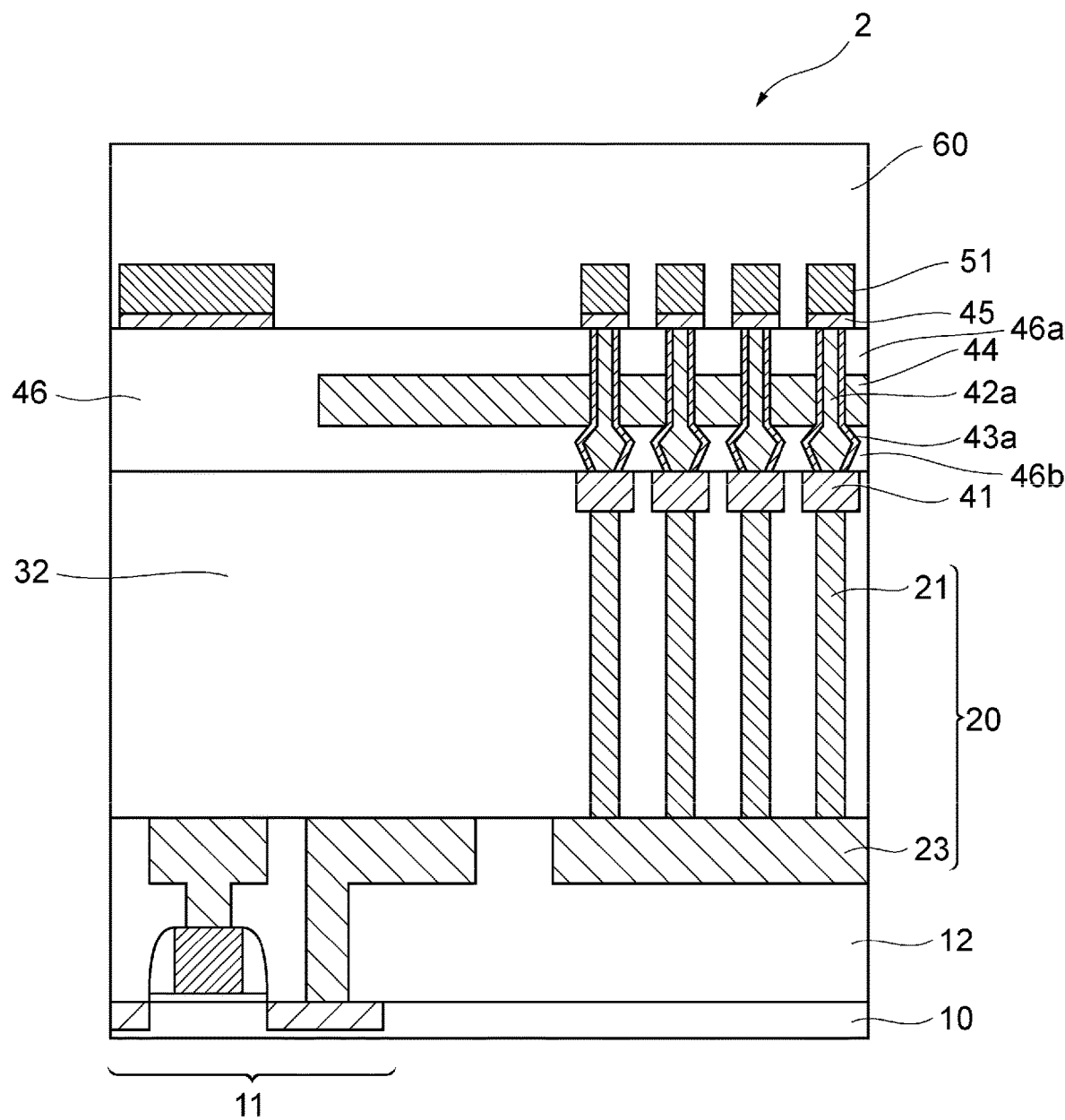
FIG. 2 is a schematic cross-sectional view showing a configuration example of a semiconductor memory device according to a second embodiment.

The semiconductor memory device 2 according to the second embodiment has the same configuration as the semiconductor memory device 1 according to the first embodiment except for the shape of the oxide semiconductor layer 42 corresponding to the channel of the field effect transistor 40 and the gate oxide film 43. That is, as shown in FIG. 2, the semiconductor memory device 2 according to the second embodiment includes the semiconductor substrate 10, the semiconductor element 11, the insulating layer 12, the capacitor structure 21, the lower capacitor electrode 23, the insulating layer 32, the lower electrode 41, the oxide semiconductor layer 42a, the gate oxide film 43a, the word line 44, the upper electrode 45, the insulating layer 46, the bit line 51, and the insulating layer 60.

As in the first embodiment, the oxide semiconductor layer 42a corresponding to the channel of the field effect transistor 40 is provided in the through via hole penetrating the insulating layer 46 and the word line 44. Therefore, the oxide semiconductor layer 42a is surrounded by the insulating layer 46 and the word line 44.

Hereinafter, differences between the shapes of the through via hole and the oxide semiconductor (FIGS. 3 and 4) according to a configuration of the field effect transistor of a comparative example for the second embodiment, and the shape of the oxide semiconductor layer 42a (FIG. 5) according to the second embodiment will be described with reference to the drawings.

Since the oxide semiconductor layer is provided in the through via hole formed by etching for vertically connecting the source and the drain of the field effect transistor, the through via hole has a tapered shape progressively narrowing in a diameter downward according to the aspect ratio. While a diameter of the through via hole may vary depending on the semiconductor process rule, for example, the diameter is 20 nm at the boundary with the upper electrode which is the uppermost portion. Therefore, the through via hole in the tapered shape may not have a sufficient diameter at the lowermost portion connected to the lower electrode. In this case, the oxide semiconductor layer formed in the through via hole also does not have a sufficient diameter at the connection portion with the lower electrode.

Figure 3:
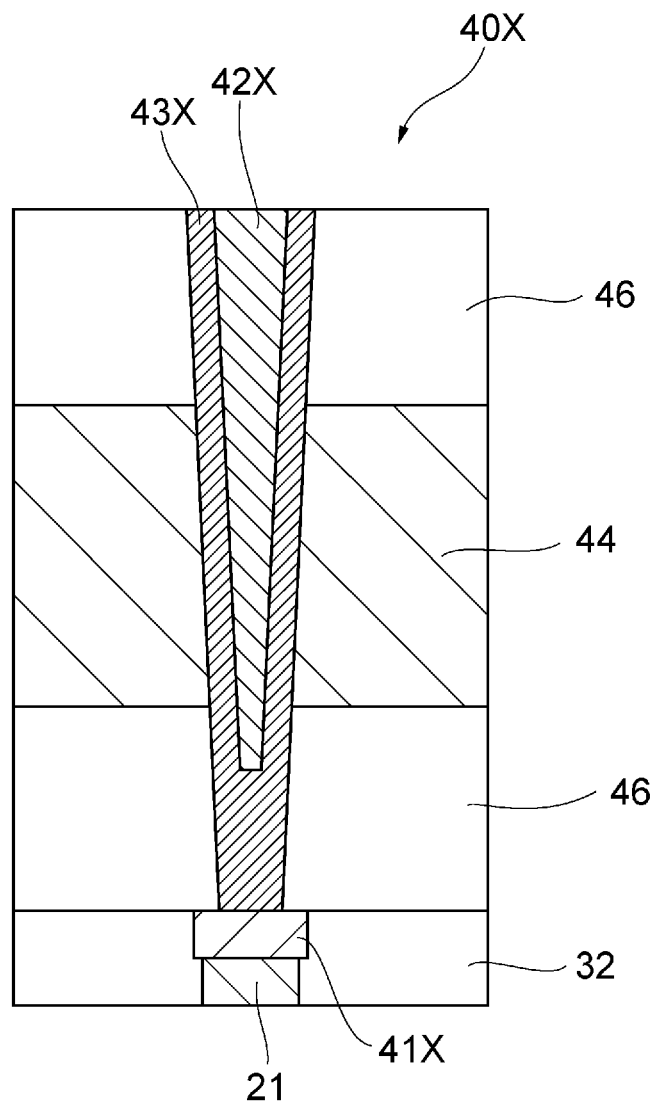
FIG. 3 is a schematic cross-sectional view showing a configuration example of a semiconductor device according to a comparative example of the second embodiment.

FIG. 3 shows, as a comparative example, a field effect transistor 40X in which a lower end of the through via hole in contact with a lower electrode 41X is too narrow, and so the lower end of the through via hole is blocked by a gate oxide film 43X and an oxide semiconductor layer 42X is not in contact with the lower electrode 41X. In the field effect transistor 40X in such a state, the upper electrode (not shown) located on the oxide semiconductor layer 42A and the lower electrode 41X are not properly connected, resulting in malfunction.

Figure 4:
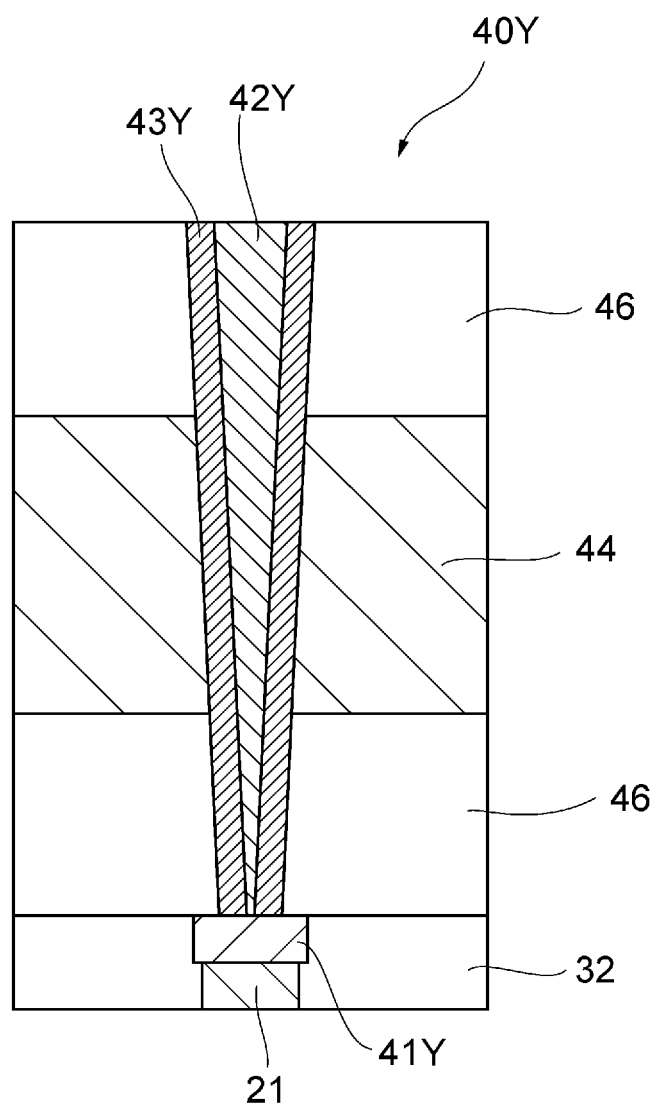
FIG. 4 is a schematic cross-sectional view showing a configuration example of a semiconductor device according to a comparative example of the second embodiment.

FIG. 4 shows, as a comparative example, a field effect transistor 40Y in which the lower end of the through via hole in contact with a lower electrode 41Y is narrowed and the area of an oxide semiconductor layer 42Y in contact with the lower electrode 41Y is extremely reduced. In the field effect transistor 40Y in such a state, the lower electrode 41Y may deteriorate due to etching ions. In addition, the electrical resistance of the oxide semiconductor layer 42Y in the vicinity of the lower electrode 41Y is extremely high, which may adversely affect the characteristics of the field effect transistor 40Y and cause malfunction in operation.

Figure 5:
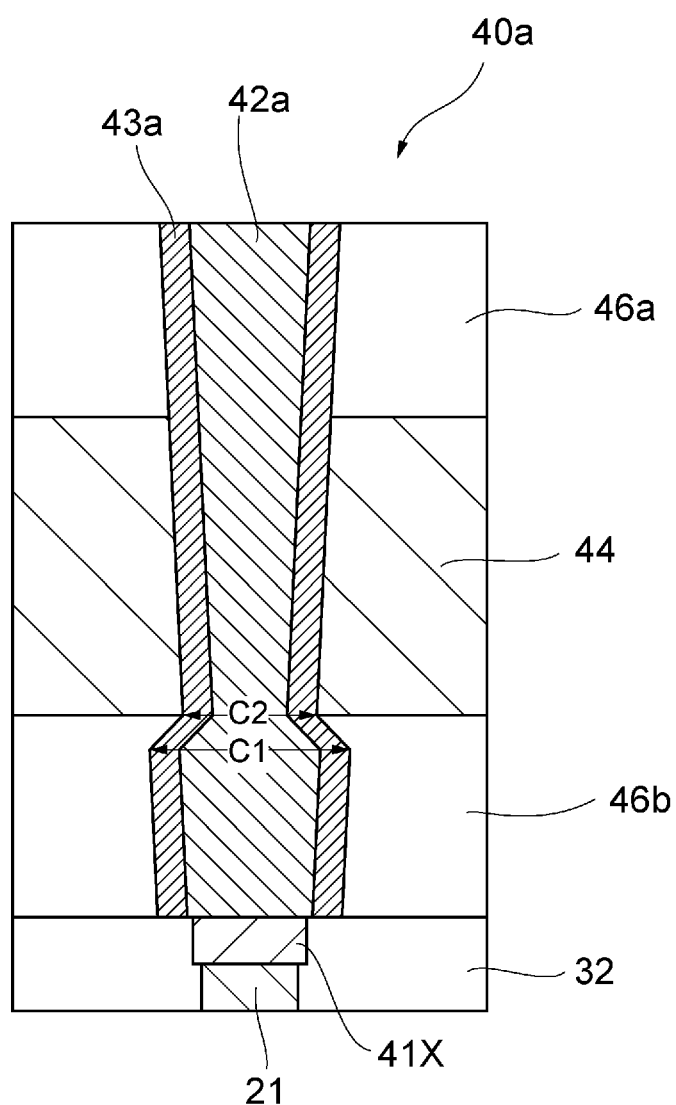
FIG. 5 is a schematic cross-sectional view showing a configuration example of a field effect transistor according to the second embodiment.

In order to avoid the problems described above, a field effect transistor 40a of the semiconductor memory device 2 according to the present embodiment is configured as follows. FIG. 5 shows a configuration example of the field effect transistor 40a according to the present embodiment. As shown in FIG. 5, the field effect transistor 40a has an upper insulating layer 46a (an example of the "second insulating film") on the upper side and a lower insulating layer 46b (an example of the "first insulating film") on the lower side with the word line 44 (an example of a "control electrode") interposed therebetween.

The upper insulating layer 46a and the lower insulating layer 46b are insulators, respectively. The upper insulating layer 46a has parameters of a film density Dt, a dielectric constant εrt, a Young's modulus Et, and an etching rate Rt. The lower insulating layer 46b has parameters of a film density Db, a dielectric constant εrb, a Young's modulus Eb, and an etching rate Rb. Since the lower insulating layer 46b has a higher etching rate than the upper insulating layer 46a, that is, Rb>Rt, the lower insulating layer 46b is processed faster than the upper insulating layer 46a during etching. The etching rate of the word lines 44 is the same as the etching rate of the upper insulating layer 46a.

An etching rate R indicates, in relative or absolute value, the amount of material removed from the element to be etched per unit time. The etching rate R and a film density D, a dielectric constant εr, and a Young's modulus E have a relationship in which the etching rate R is decreased as each of the film density D, the dielectric constant εr, and the Young's modulus E is increased. Therefore, when the etching rate Rb is higher than the etching rate Rt, at least one of: the film density Db<Dt; the dielectric constant εrb<εrt; or the Young's modulus Eb<Et is established. However, in the present embodiment, as long as the etching rate satisfies the relationship of Rb>Rt, the high-low relationship of the film density D, the relative dielectric constant εr, and the Young's modulus E is not essentially required.

In addition, the etching rate may vary depending on the etching method adopted or the material to be removed by etching, and the etching rate as used herein indicates the amount of material removed from the element to be etched per unit time in relative or absolute value, when considering the etching method adopted or the material removed by etching.

As described above, when the etching rate Rb of the lower insulating layer 46b is greater than the etching rate Rt of the upper insulating layer 46a, the lower insulating layer 46b is removed more than the upper insulating layer 46a while the etching for forming the through via holes is performed. Therefore, the formed through via hole has a shape that is partially widened on the lower insulating layer 46b side as indicated by the boundaries between the gate oxide film 43a and the upper insulating layer 46a, the word line 44, and the lower insulating layer 46b shown in FIG. 5. More specifically, as shown in FIG. 5, a maximum diameter C1 of the through via hole under the boundary between the lower insulating layer 46b and the word line 44 is greater than a diameter C2 of the through via hole at the boundary between the lower insulating layer 46b and the word line 44. It is noted that the diameter of the through via hole is obtained in a cross section in a plane perpendicular to a stacking direction.

When the gate oxide film 43a and the oxide semiconductor layer 42a are formed in the through via hole formed in the shape described above in the processes after the etching for forming the through via hole, the gate oxide film 43a and the oxide semiconductor layer 42a has shapes as shown in FIG. 5. That is, the oxide semiconductor layer 42a does not have a simple tapered shape, but has a shape in which the diameter is at least partially increased at a location corresponding to the lower insulating layer 46b. More specifically, the maximum diameter of the oxide semiconductor layer 42a under the boundary between the lower insulating layer 46b and the word line 44 is greater than the diameter at the boundary between the lower insulating layer 46b and the word line 44.

For example, the upper insulating layer 46a includes a silicon oxide film ($SiO_2$) formed by a CVD method using tetraethoxysilane (TEOS), a silicon nitride film (P—SiN) formed by the plasma CVD method, a silicon oxide film (ALD SiO) formed by atomic layer deposition method, or the like.

For example, the lower insulating layer 46b includes a silicon oxide film ($SiO_2$) formed by the CVD method using tetraethoxysilane (TEOS), a carbon-added silicon nitride film (SiOC), a partially stabilized zirconia (PSZ), or the like.

The upper insulating layer 46a is preferably formed using $NH_3$-containing gas in the initial step in order to ensure adhesion with the word line 44 in contact with the lower layer. Meanwhile, the lower insulating layer 46b is preferably formed without using $NH_3$-containing gas in the initial step in order to ensure adhesion with the lower electrode 41 in contact with the lower layer.

Method for Manufacturing Semiconductor Memory Device 2

Next, the characteristics of the method for manufacturing the semiconductor memory device 2 according to the present embodiment will be described. A known method for manufacturing a semiconductor device can be adopted for the processes other than the processes described below.

Figure 6:
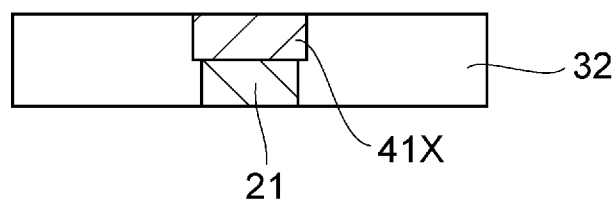
FIG. 6 is a schematic cross-sectional view showing an example of a method for manufacturing the semiconductor device according to the second embodiment.

FIG. 6 is a diagram showing the vicinity of the field effect transistor 40a in the semiconductor memory device 2 after completing the manufacturing process up to the layer including the lower electrode 41 and the insulating layer 32 in FIG. 2.

Figure 7:
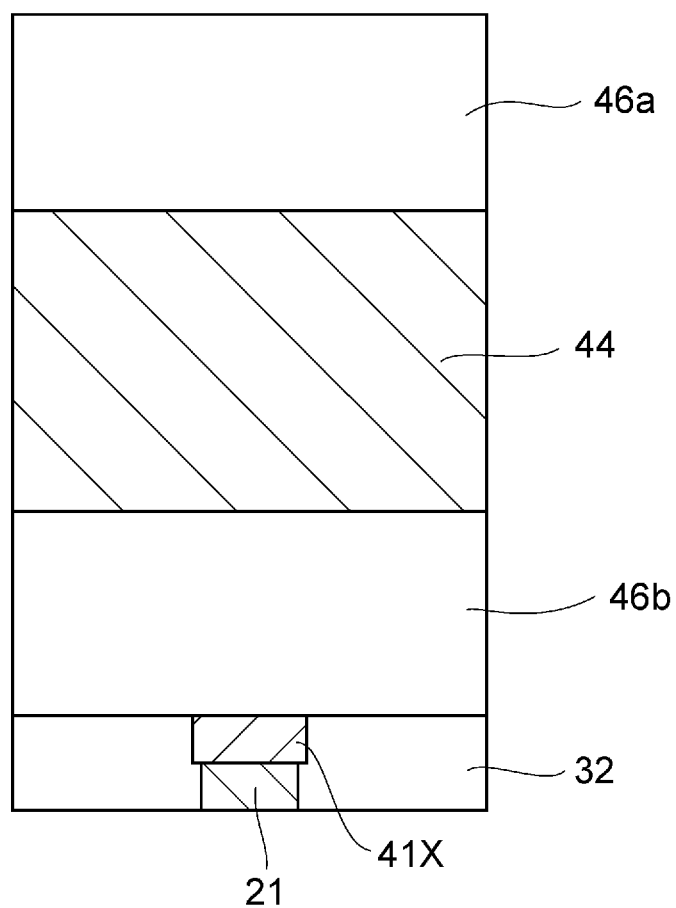
FIG. 7 is a schematic cross-sectional view showing an example of the method for manufacturing the semiconductor device according to the second embodiment.

From the state shown in FIG. 6 described above, the lower insulating layer 46b, the word line 44, and the upper insulating layer 46a are formed in order. FIG. 7 shows the semiconductor memory device 2 in which the lower insulating layer 46b, the word line 44, and the upper insulating layer 46a are formed.

For example, as already described, the lower insulating layer 46b includes the silicon oxide film ($SiO_2$) formed by the CVD method using tetraethoxysilane (TEOS), the carbon-added silicon nitride film (SiOC), the partially stabilized zirconia (PSZ), or the like.

The word line 44 is formed by forming an insulating layer in a layer above the lower insulating layer 46b by a known method, removing part of the insulating layer by etching, and then forming a film of a conductor such as tungsten or the like.

As already described, the upper insulating layer 46a includes the silicon oxide film ($SiO_2$) formed by the CVD method using tetraethoxysilane (TEOS), the silicon nitride film (P—SiN) formed by the plasma CVD method, the silicon oxide film (ALD SiO) formed by atomic layer deposition method, or the like.

It is noted that while a method for manufacturing the upper insulating layer 46a and the lower insulating layer 46b different from the example described above may be adopted, the adopted manufacturing method has to ensure that at least the lower insulating layer 46b has a higher etching rate than the upper insulating layer 46a.

Figure 8:
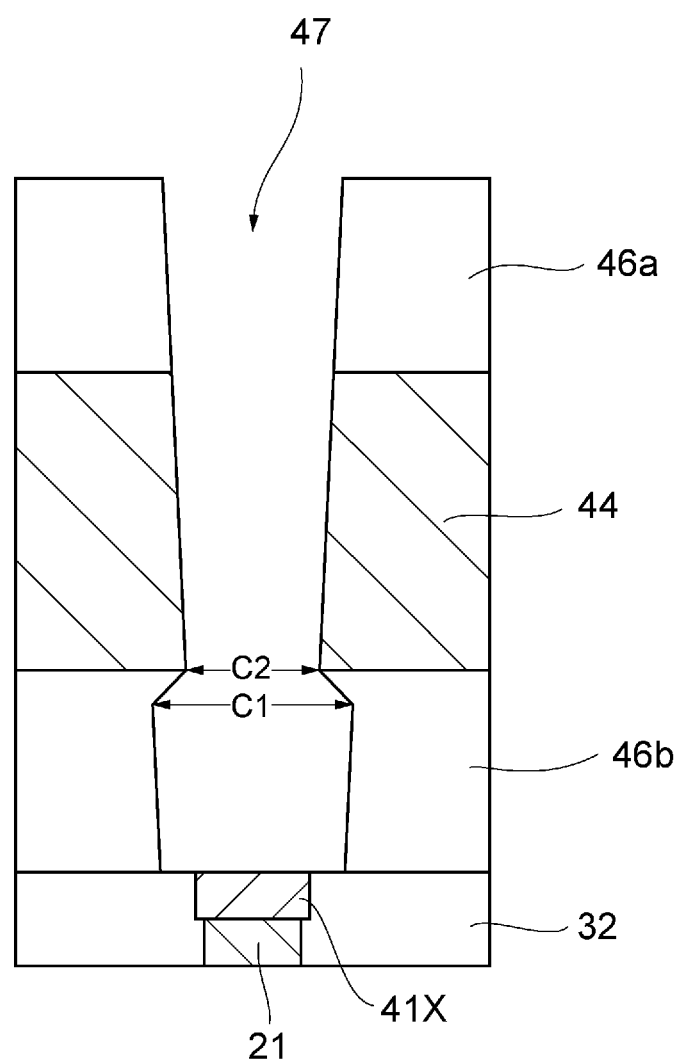
FIG. 8 is a schematic cross-sectional view showing an example of the method for manufacturing the semiconductor device according to the second embodiment.

Then, a through via hole 47 is formed by etching to penetrate the upper insulating layer 46a, the word lines 44, and the lower insulating layer 46b. FIG. 8 shows the semiconductor memory device 2 in which the through via hole is formed. Since the lower insulating layer 46b has a higher etching rate than the upper insulating layer 46a, as shown in FIG. 8, in the through via hole 47, the maximum diameter C1 of the through via hole 47 under the boundary between the lower insulating layer 46b and the word line 44 is greater than the diameter C2 of the through via hole 47 at the boundary between the lower insulating layer 46b and the word line 44.

Figure 9:
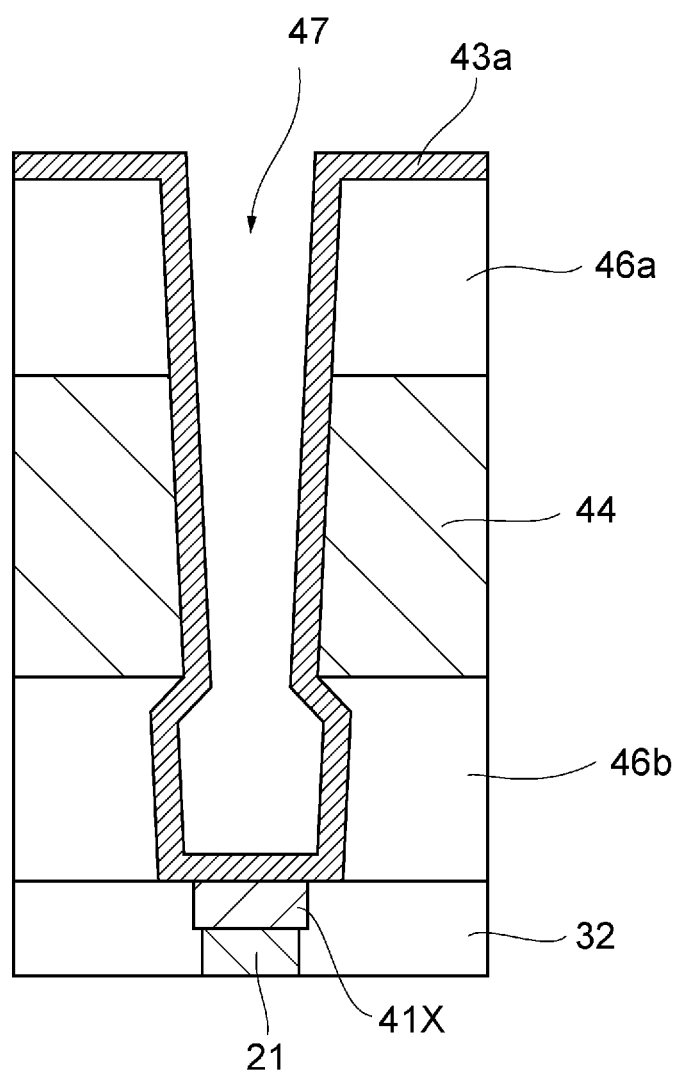
FIG. 9 is a schematic cross-sectional view showing an example of the method for manufacturing the semiconductor device according to the second embodiment.
Figure 10:
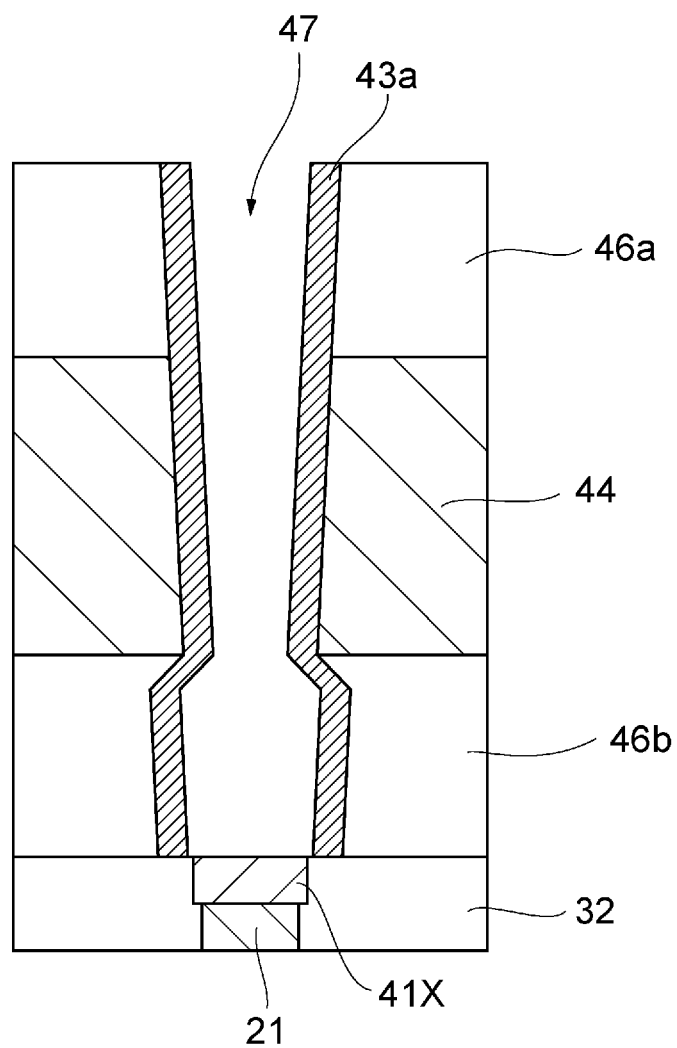
FIG. 10 is a schematic cross-sectional view showing an example of the method for manufacturing the semiconductor device according to the second embodiment.

Then, after forming the gate oxide film 43a as shown in FIG. 9 by a known method, unnecessary gate oxide film 43a is removed by etching as shown in FIG. 10.

Figure 11:
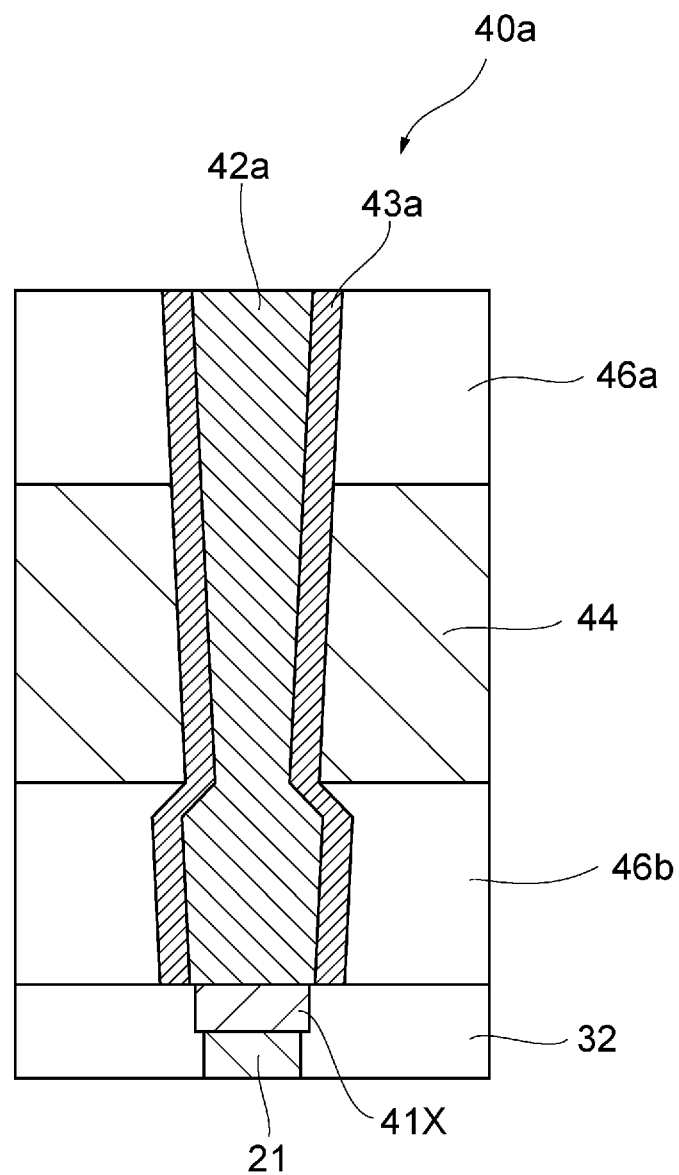
FIG. 11 is a schematic cross-sectional view showing an example of the method for manufacturing the semiconductor device according to the second embodiment.

Then, the oxide semiconductor layer 42a is formed in the through via hole 47 in which the gate oxide film 43a is formed. Thus, the field effect transistor 40a of the semiconductor memory device 2 as shown in FIG. 11 is obtained. From this state, the semiconductor memory device 2 as shown in FIG. 2 is manufactured by forming the upper electrode 45 and the like on the upper layer.

The manufacturing process described above is merely an example, and a similar configuration may be manufactured by another semiconductor manufacturing process. For example, the etching in each process may employ either dry etching or wet etching as needed.

Modifications

For example, the field effect transistor in the semiconductor memory device 2 according to the present embodiment is not limited to the configuration described above, and may have the following configurations.

First Modification

Figure 12:
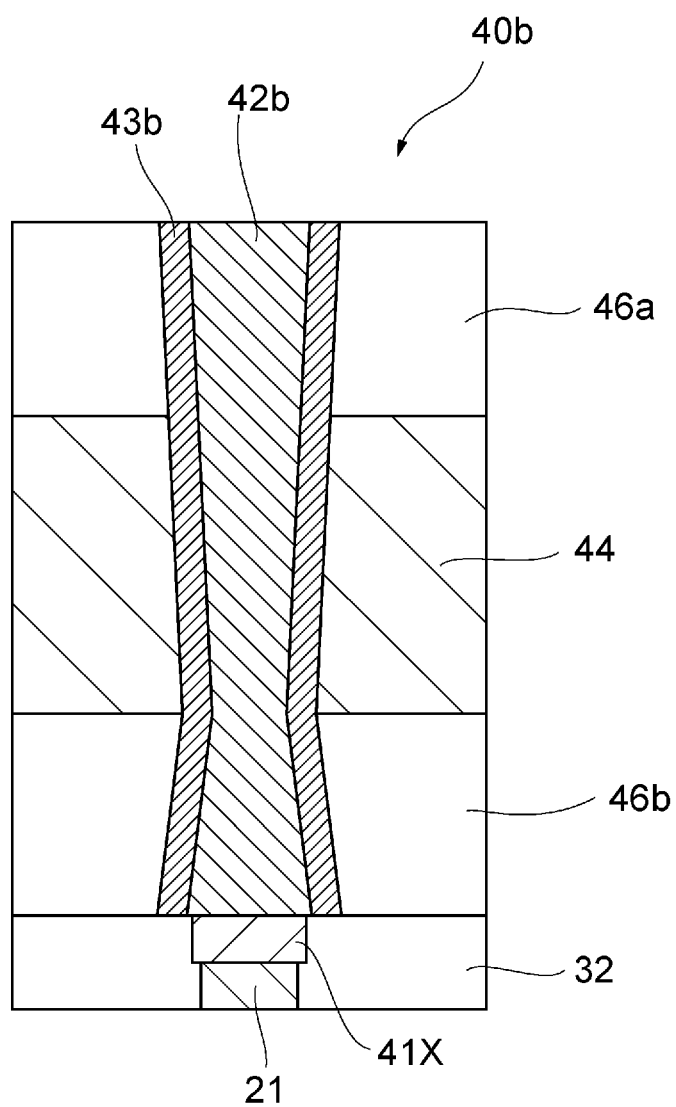
FIG. 12 is a schematic cross-sectional view showing a configuration example of a field effect transistor according to a first modification of the second embodiment.
Figure 13:
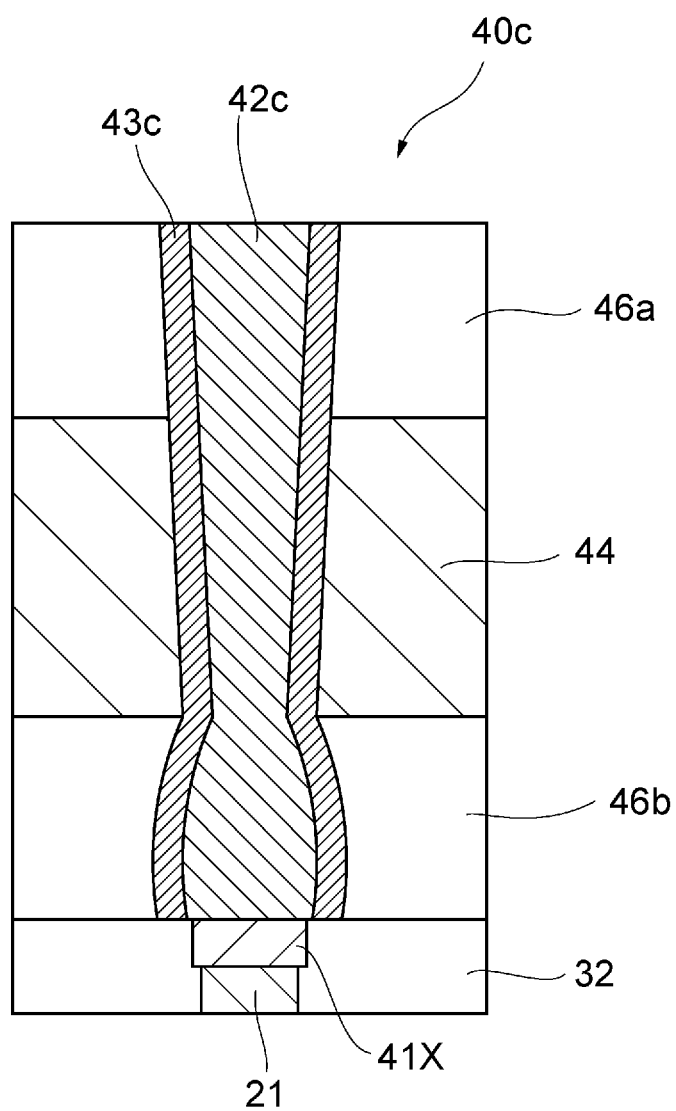
FIG. 13 is a schematic cross-sectional view showing a configuration example of the field effect transistor according to the first modification of the second embodiment.

In field effect transistors 40b and 40c according to a first modification, the through via holes, gate oxide films 43b and 43c, and oxide semiconductor layers 42b and 42c are formed in the shapes shown in FIGS. 12 and 13, respectively. In this modification, the relationship between the etching rates of the upper insulating layer 46a and the lower insulating layer 46b is the same as in the second embodiment. For example, by employing the known process conditions different from those of the second embodiment, it is possible to form the through via holes as indicated by the outer edge of the gate oxide film 43b or 43c shown in FIGS. 12 and 13. After forming the through via holes, the gate oxide films 43b and 43c and the oxide semiconductor layers 42b and 42c can be formed, respectively by the same method as in the second embodiment.

Second Modification

Figure 14:
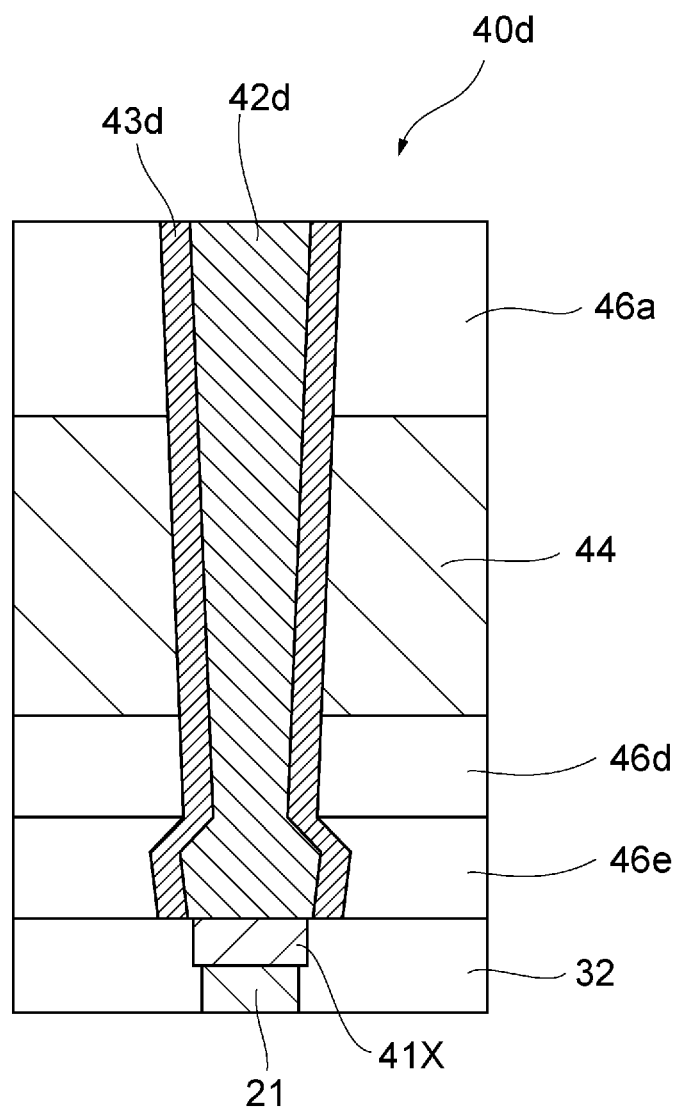
FIG. 14 is a schematic cross-sectional view showing a configuration example of a field effect transistor according to a second modification of the second embodiment.

As shown in FIG. 14, in a field effect transistor 40d according to a second modification, the lower insulating layer 46b in the second embodiment includes a plurality of insulating layers such as a first lower insulating layer 46d (an example of a "first film") and a second lower insulating layer 46e (an example of a "second film"). The first lower insulating layer 46d is located above the second lower insulating layer 46e. In this case, for example, the upper insulating layer 46a and the first lower insulating layer 46d have the same etching rate, and the etching rate of the second lower insulating layer 46e is higher than the etching rate of the first lower insulating layer 46d. At this time, for example, the upper insulating layer 46a and the first lower insulating layer 46d include a material having the same film density, dielectric constant, or Young's modulus, and the second lower insulating layer 46e includes a material having a lower film density, dielectric constant, or Young's modulus than the first lower insulating layer 46d.

With such a configuration, as shown in FIG. 14, since the second lower insulating layer 46e is easier to process by etching than the first lower insulating layer 46d, a through via hole is formed as indicated by the outer edge of the gate oxide film 43d in FIG. 14. That is, the maximum diameter of the through via hole under the boundary between the first lower insulating layer 46d and the second lower insulating layer 46e is greater than the diameter of the through via hole at the boundary between the first lower insulating layer 46d and the second lower insulating layer 46e. After forming the through via hole, the gate oxide film 43d and the oxide semiconductor layer 42d are formed by the same method as in the second embodiment.

Third Modification

Figure 15:
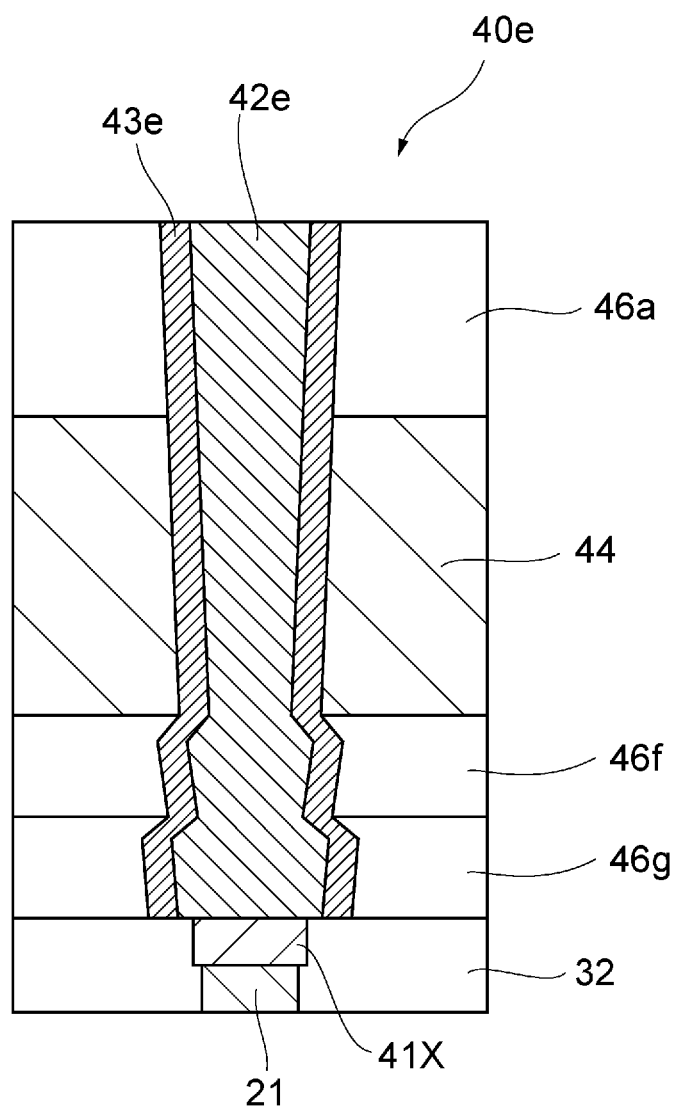
FIG. 15 is a schematic cross-sectional view showing a configuration example of a field effect transistor according to a third modification of the second embodiment.

In a field effect transistor 40e according to the third modification shown in FIG. 15, as in the second modification of FIG. 14, the lower insulating layer 46b in the second embodiment includes a third lower insulating layer 46f and a fourth lower insulating layer 46g, which are a plurality of insulating layers, but these insulating layers have the different high-low relationship of etching rates.

In a third modification, the etching rate increases in the order of the upper insulating layer 46a, the third lower insulating layer 46f, and the fourth lower insulating layer 46g. At this time, for example, each layer of the upper insulating layer 46a, the third lower insulating layer 46f, and the fourth lower insulating layer 46g includes a material such that any one of the film density, the dielectric constant, or the Young's modulus decreases in the order of the upper insulating layer 46a, the third lower insulating layer 46f, and the fourth lower insulating layer 46g.

With such a configuration, the removal of material by etching progresses more easily in the third lower insulating layer 46f than in the upper insulating layer 46a, and also the removal of material by etching progresses more easily in the fourth lower insulating layer 46g than in the third lower insulating layer 46f. Therefore, a through via hole is formed as indicated by the outer edge of gate oxide film 43e in FIG. 15. After forming the through via hole, the gate oxide film 43e and the oxide semiconductor layer 42e are formed by the same method as in the second embodiment.

Other Modifications

In the field effect transistor of the semiconductor memory device 2 shown in the second embodiment and the modifications, the description is made based on the assumption that the cross section of the through via hole is circular, but the cross section of the through via hole does not necessarily have to be circular, and may be rectangular, elongated, or any other shape. In this case, the diameter of the through via hole described in the embodiment and modifications can be considered in place of the cross-sectional area in the plane perpendicular to the stacking direction. That is, for example, in the embodiment, the cross-sectional area of the through via hole under the boundary between the lower insulating layer 46b and the word line 44 is greater than the cross-sectional area of the through via hole at the boundary between the lower insulating layer 46b and the word line 44.

As described above, the field effect transistor of the semiconductor memory device 2 according to the second embodiment and each modification includes a first insulating film (the lower insulating layer 46b, and the like), a control electrode (the word line 44) formed on the first insulating film, and a channel (the oxide semiconductor layer 42a, and the like). The channel is surrounded by the first insulating film and the control electrode, and includes an oxide semiconductor formed in a through via hole having a first area in a cross section in a plane perpendicular to the stacking direction at a boundary between the first insulating film and the control electrode, and having a second area greater than the first area in a cross section in a plane perpendicular to the stacking direction under the boundary. With such a configuration, it is possible to reduce the occurrence of poor connection between the upper electrode 45 and the lower electrode 41. In addition, it is possible to reduce a decrease in on-current when the field effect transistor 40a or the like is turned on, which occurs due to the excessively narrowing lower end portion of the tapered channel and increasing resistance.

In addition, the field effect transistor of the semiconductor memory device 2 according to the second embodiment and each modification further includes the second insulating film (the upper insulating layer 46a). In this case, the through via hole is surrounded by the first insulating film, the control electrode, and the second insulating film. In addition, an etching rate of the first insulating film is higher than an etching rate of the second insulating film. With such a configuration, the first insulating film is etched faster than the second insulating film, and the through via holes and channels described above can be formed.

Instead of the etching rate relationship as described above, the first insulating film may have at least one of the film density, the dielectric constant, and the Young's modulus lower than that of the second insulating film. As a result, the etching rate relationship described above can be obtained, and the through via holes and channels having the configurations described above can be formed.

Further, it is preferable that the etching rate of the first insulating film is higher than the etching rate of the control electrode. According to such a configuration, since the first insulating layer is etched faster than the control electrode, it is easier to form the through via holes and channels as described above.

It is noted that instead of the etching rate relationship between the first insulating film and the control electrode as described above, the first insulating film may have at least one of the film density, the dielectric constant, and the Young's modulus lower than that of the control electrode. As a result, the etching rate relationship described above can be obtained, and the through via holes and channels having the configurations described above can be formed.

In addition, as shown in the second and third modifications described above, the first insulating film may include a first film (the first lower insulating layer 46d or the third lower insulating layer 46f) and a second film (the second lower insulating layer 46e or the fourth lower insulating layer 46g) formed under the first film. In this case, at least one of the etching rate of the first layer and the etching rate of the second layer may be higher than the etching rate of the second insulating film. According to such a configuration, the first layer or the second layer having an etching rate higher than the etching rate of the second insulating film is etched faster than the second insulating film. As a result, it is possible to form a field effect transistor having the configuration illustrated in the second or third modification, and it is possible to reduce the occurrence of poor connection between the upper electrode 45 and the lower electrode 41 and to reduce the decrease in on-current when the field effect transistor is turned on.

In addition, the following additional appendix will be disclosed with respect to the embodiments described above.

APPENDIX

A semiconductor device including
a semiconductor substrate,
a first semiconductor element provided on the semiconductor substrate and having a channel including an element other than oxygen atoms,
a first insulating film that insulates the first semiconductor element,
a second semiconductor element provided above the first semiconductor element and spaced apart from the semiconductor substrate and having a channel including an element including oxygen atoms,
a second insulating film that insulates the second semiconductor element,
a fourth insulating film provided between the first insulating film and the second insulating film, and
a third insulating film provided above the second semiconductor element and spaced apart from the semiconductor substrate, and having a film density less than at least one of the film densities of the first, second, and fourth insulating films.

The first and second embodiments, and the modifications of each embodiment are described above with reference to specific examples. However, the present disclosure is not limited to these specific examples. These specific examples with appropriate design changes by those skilled in the art are also provided in the scope of the present disclosure as long as they have the features of the present disclosure. Each element provided in each specific example described above and its arrangement, conditions, shape, and the like are not limited to those illustrated and can be changed as appropriate. The combinations of the elements in each of the specific examples described above can be appropriately changed as long as there is no technical contradiction.

For example, the configuration of the present disclosure is not limited to the semiconductor memory devices 1 and 2 according to the embodiments and modifications, and may be applied to semiconductor devices other than the memory devices. In this case, the semiconductor device may be configured without the capacitor 20.

The semiconductor memory devices 1 and 2 according to the embodiments may be semiconductor devices in which a plurality of capacitors 20 and field effect transistors 40 are formed in the stacking direction.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a semiconductor substrate;
   a first layer formed on the semiconductor substrate, and including a semiconductor element and a first insulating film;
   a second layer formed above the first layer, and including a channel including an oxide semiconductor and a second insulating film; and
   a third layer formed above the second layer, and including an electrode formed on the channel and a third insulating film having a film density less than at least one of a film density of the first insulating film or a film density of the second insulating film.

2. The semiconductor device according to claim 1, further comprising a fourth layer formed between the first layer and the second layer, and including a capacitor and a fourth insulating film,
   wherein the first, second, third, and fourth insulating films have first, second, third, and fourth film densities, respectively, and
   the third film density is less than at least one of the first film density, second film density, or fourth film density.

3. The semiconductor device according to claim 1, further comprising a hydrogen barrier film configured to prevent hydrogen from diffusing into the channel.

4. A semiconductor device comprising:
   a first insulating film;
   a control electrode formed on the first insulating film; and
   a channel surrounded by the first insulating film and the control electrode, and including an oxide semiconductor filling a through via hole that extends through at least the first insulating film and the control electrode,
   wherein the channel has a first cross-sectional area at a boundary between the first insulating film and the control electrode, and having a second cross-sectional area under the boundary, and wherein the second area is greater than the first area.

5. The semiconductor device according to claim 4, further comprising a second insulating film formed on the control electrode,
   wherein the through via hole extends through the first insulating film, the control electrode, and the second insulating film, and
   an etching rate of the first insulating film is higher than an etching rate of the second insulating film.

6. The semiconductor device according to claim 4, further comprising a second insulating film formed on the control electrode,
   wherein the through via hole extends through the first insulating film, the control electrode, and the second insulating film, and
   the first insulating film has at least one of a film density, a dielectric constant, or a Young's modulus less than that of the second insulating film.

7. The semiconductor device according to claim 4, wherein the etching rate of the first insulating film is higher than an etching rate of the control electrode.

8. The semiconductor device according to claim 4, wherein the first insulating film has at least one of a film density, a dielectric constant, or a Young's modulus lower than that of the control electrode.

9. The semiconductor device according to claim 4, further comprising a second insulating film formed on the control electrode,
   wherein the first insulating film includes a first film and a second film formed under the first film, and
   an etching rate of at least one of the first film or the second film is higher than an etching rate of the second insulating film.

10. The semiconductor device according to claim 4, further comprising a second insulating film formed on the control electrode,
    wherein the first insulating film includes any one of a silicon oxide film formed using tetraethoxysilane, a silicon nitride film formed by a plasma CVD method, or a silicon oxide film formed by an atomic layer deposition method, and
    the second insulating film includes any one of a silicon oxide film formed using tetraethoxysilane, a carbon-added silicon nitride film, or partially stabilized zirconia, which has a higher etching rate than the first insulating film.

11. The semiconductor device according to claim 4, further comprising a second insulating film formed on the control electrode,
    wherein the second insulating film is formed using NH$_3$-containing gas in an initial step, and
    the first insulating film is formed using NH$_3$-free gas in the initial step.

12. A method for fabricating semiconductor devices, comprising:
    forming a control electrode formed on a first insulating film;
    forming a second insulating film on the control electrode;
    forming a through via hole extending through the second insulating film, the control electrode, and the first insulating film, wherein the through via hole includes a first cross-sectional area at a boundary between the first insulating film and the control electrode and a second cross-sectional area under the boundary, and wherein the second area is greater than the first area; and
    filling the through via hole with at least an oxide semiconductor.

13. The method according to claim 12, wherein an etching rate of the first insulating film is higher than an etching rate of the second insulating film.

14. The method according to claim 12, wherein the first insulating film has at least one of a film density, a dielectric constant, or a Young's modulus less than that of the second insulating film.

15. The method according to claim 12, wherein the etching rate of the first insulating film is higher than an etching rate of the control electrode.

16. The method according to claim 12, prior to the step of filling the through via hole with at least an oxide semiconductor, further comprising:

lining inner sidewalls of the through via hole with a gate oxide film.

\* \* \* \* \*